United States Patent
Bhardwaj et al.

(10) Patent No.: US 11,356,238 B1
(45) Date of Patent: Jun. 7, 2022

(54) SYNCHRONIZATION BETWEEN DEVICES FOR PWM WAVEFORMS

(71) Applicant: TEXAS INSTRUMENTS INCORPORATED, Dallas, TX (US)

(72) Inventors: Manish Bhardwaj, Poughkeepsie, NY (US); Venkataratna Subrahmanya Bharathi Akondy, Cypress, TX (US); Shamim Choudhury, Katy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/328,561

(22) Filed: May 24, 2021

(51) Int. Cl.
```
H03K 7/08      (2006.01)
H03K 9/08      (2006.01)
H04L 7/00      (2006.01)
H04L 7/06      (2006.01)
```

(52) U.S. Cl.
CPC .............. H04L 7/0016 (2013.01); H04L 7/06 (2013.01)

(58) Field of Classification Search
CPC ......... H04L 7/0016; H04L 7/06; H03K 21/02; H03K 7/08; H02J 9/062; H02J 3/40; H02M 5/458; H02M 1/08; G06F 1/04
USPC ................... 375/238, 354, 356, 257
See application file for complete search history.

(56) References Cited

U.S. PATENT DOCUMENTS

| | | | |
|---|---|---|---|
| 8,362,819 B1 * | 1/2013 | Kris | G06F 1/04 327/175 |
| 8,917,047 B2 * | 12/2014 | Li | H02M 5/458 318/503 |
| 2006/0006741 A1 * | 1/2006 | Tassitino | H02J 9/062 307/82 |
| 2006/0064609 A1 * | 3/2006 | Bryan | H03K 7/08 714/700 |
| 2008/0265680 A1 * | 10/2008 | Marwali | H02J 9/062 307/65 |
| 2011/0280299 A1 * | 11/2011 | O'Malley | H03K 7/08 375/238 |
| 2013/0082794 A1 * | 4/2013 | Kris | H03K 7/08 332/108 |
| 2016/0064935 A1 * | 3/2016 | Gao | H02J 3/40 307/82 |
| 2020/0321872 A1 * | 10/2020 | Upadhyaya | H02M 1/08 |
| 2021/0336608 A1 * | 10/2021 | Akondy Raja Raghupathi | H03K 21/02 |

* cited by examiner

*Primary Examiner* — Phuong Phu
(74) *Attorney, Agent, or Firm* — Brian D. Graham; Charles A. Brill; Frank D. Cimino

(57) ABSTRACT

A system includes a first controller configured to transmit a synchronization signal to a second controller. The second controller is configured to produce a PWM signal. The system also includes a counter configured to provide a count for the second controller, where the second controller is configured to initiate rising edges and falling edges of the PWM signal based on the count from the counter. The second controller is also configured to measure an error between a time when the synchronization signal is received at the second controller and an expected time of receipt for the synchronization signal. The second controller is also configured to adjust a period of the counter based at least in part on the error.

20 Claims, 4 Drawing Sheets

SYNCHRONIZATION BETWEEN DEVICES FOR PWM WAVEFORMS

BACKGROUND

Power electronics systems may use distributed architectures for power converters. Distributed architectures have multiple power stages, with a separate controller managing each power stage. A pulse-width modulation (PWM) signal is provided by each controller to that controller's respective power stage. The power stages are synchronized for proper operation. For example, the PWM signals created by the separate controllers may include a phase shift between the PWM signals. To ensure the PWM signals from the separate controllers maintain a specific phase shift, a synchronization signal is transmitted from one of the controllers, designated as a primary controller, to the other controllers, designated as secondary controllers.

SUMMARY

In accordance with at least one example of the description, a method includes producing a PWM signal with a counter, where a rising or falling edge of the PWM signal is based on a count from the counter. The method also includes transmitting a synchronization signal from a first controller to a second controller. The method includes measuring an error between a time when the synchronization signal is received at the second controller and an expected time of receipt for the synchronization signal. The method also includes adjusting a period of the counter based at least in part on the error.

In accordance with at least one example of the description, a system includes a first controller configured to transmit a synchronization signal to a second controller. The second controller is configured to produce a PWM signal. The system also includes a counter configured to provide a count for the second controller, where the second controller is configured to initiate rising edges and falling edges of the PWM signal based on the count from the counter. The second controller is also configured to measure an error between a time when the synchronization signal is received at the second controller and an expected time of receipt for the synchronization signal. The second controller is also configured to adjust a period of the counter based at least in part on the error.

In accordance with at least one example of the description, a system includes a first controller configured to produce a PWM signal with a counter, where a rising edge of the PWM signal is based on a count from the counter. The first controller is configured to receive a synchronization signal from a second controller. The first controller is also configured to measure an error between a time when the synchronization signal is received and an expected time of receipt for the synchronization signal. The first controller is configured to adjust a period of the counter based at least in part on the error.

DETAILED DESCRIPTION

Power electronics systems may use a distributed architecture for power converters, where a separate controller manages each power stage. Each controller provides a PWM signal to that controller's respective power stage. The PWM signals are generated using a counter within each controller. The counter within each controller controls the on-time and the frequency of the PWM signal. A clock within each controller controls the counter, and each clock is generated by an oscillator. Oscillators inside different controllers may drift over time until they are no longer synchronized. Therefore, to maintain synchronization between the power stages, a synchronization signal is transmitted from a primary controller to all other secondary controllers. After receiving the synchronization signal, the secondary controllers reset their counters to a known value that is synchronized with the primary controller. However, the synchronization signal may arrive at the secondary controller at any time, and certain timings may cause the counter to reset in such a way that causes a glitch in the PWM signal. Oscillator drift is one example for why synchronization is used across different devices, but the clocks within the devices may drift for other reasons as well.

In examples herein, a primary controller transmits a synchronization signal to one or more secondary controllers. After receiving the synchronization signal, the secondary controller measures a difference, or error, between the actual time the synchronization signal is received and the expected time the synchronization signal should have been received. Then, instead of adjusting the counter immediately or near immediately after receiving the synchronization signal, the secondary controller adjusts a period of the counter over one or more subsequent PWM periods until the secondary controller's counter is synchronized with the primary controller's counter. If additional synchronization signals are received by the secondary controller, the error is calculated again for each synchronization signal and the period of the counter is continually updated. Updating the period of the counter in the secondary controller in this manner prevents fast and large changes in the count of the counter that may cause PWM glitches.

Figure 1:
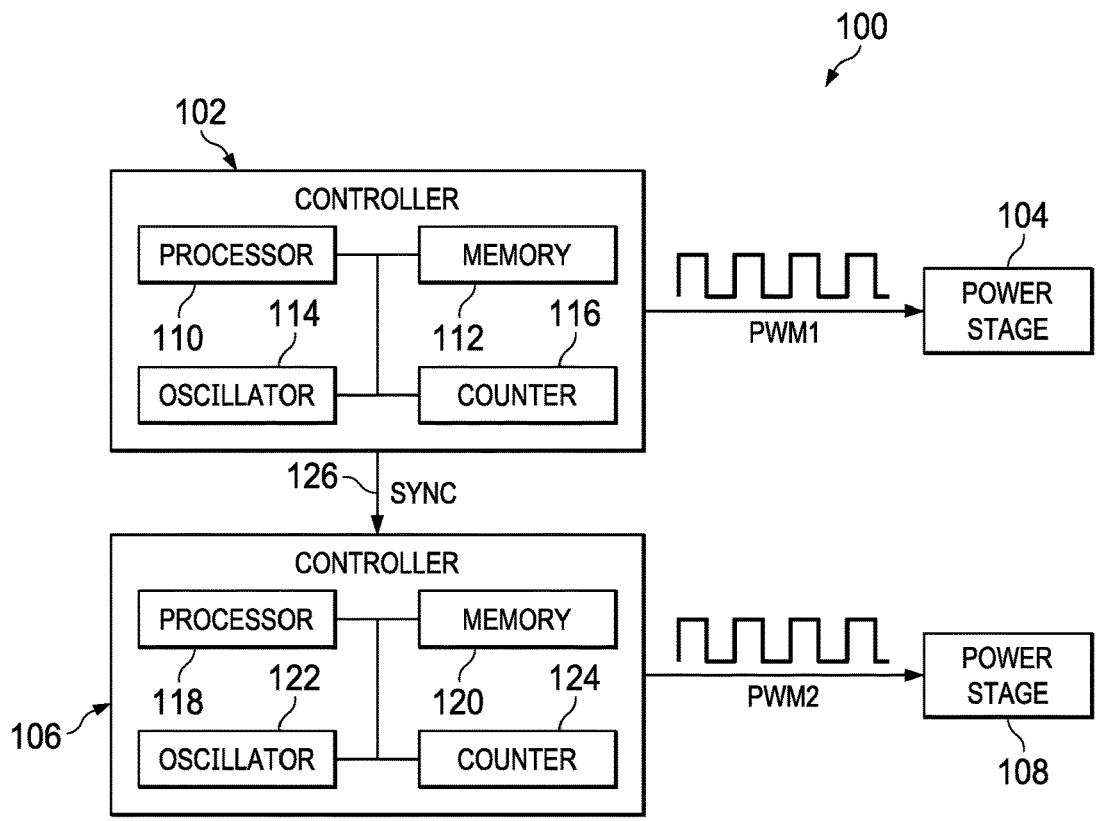
FIG. 1 is a power system for PWM synchronization across multiple devices in accordance with various examples.

FIG. 1 is a power system 100 for PWM synchronization across multiple devices in accordance with various examples herein. Power system 100 includes controller 102, power stage 104, controller 106, and power stage 108. Controller 102 includes processor 110, memory 112, oscillator 114, and counter 116. Controller 106 includes processor 118, memory 120, oscillator 122, and counter 124. A link 126 provides a SYNC (synchronization) signal and couples controller 102 to controller 106.

Controller 102 provides a PWM signal (PWM1) to power stage 104 to control power stage 104. In that regard, the power stage 104 is an example of a PWM-controlled circuit. Other examples of PWM-controlled circuits suitable for use with controller 102 include motors, motor controllers, servos, amplifiers, voltage converters, and signal generators. Controller 106 provides a PWM signal (PWM2) to power stage 108 to control power stage 108. Similar to power stage 104, power stage 108 is merely one example of a suitable PWM-controlled circuit. Each PWM signal has a frequency and a duty cycle. The duty cycle is the fraction of a period when the PWM signal is high. In a power system example, the frequency and the duty cycle may be varied to vary the output power provided by the power stages 104, 108. In this example, controller 102 is a primary controller and controller 106 is a secondary controller. In other examples, a primary controller may control more than one secondary controller. The primary controller communicates with each of the secondary controllers via a link, such as link 126. The links may directly or indirectly couple the primary controller to each of the secondary controllers, so that the primary controller may provide a synchronization signal to each of the secondary controllers.

Controller 102 and controller 106 operate similarly, with or without phase shift, to provide the respective PWM signals to the power stages 104 and 108, respectively. In controller 102, processor 110 controls the operation of the components of controller 102. Memory 112 stores data within controller 102, such as duty cycle information, synchronization signal information, and executable code. Oscillator 114 provides a clock for the components within controller 102. The actions of the components within controller 102 are synchronized using the clock provided by oscillator 114. Counter 116 is a counter that is useful for generating the PWM1 signal. In one example, to generate a PWM signal, counter 116 runs from 0 to a high number, such as 400. Counter 116 is incremented by one at each clock cycle provided by the clock produced by oscillator 114. To generate the PWM1 signal, controller 102 outputs a low signal when counter 116 is between 0 and X−1, where X is a number between 0 and 400. The value of X determines the duty cycle of the PWM signal output by each of the controllers 102 and 106. When counter 116 reaches X, controller 102 outputs a high signal. If counter 116 is between X and 400, controller 102 outputs the high signal. When counter 116 reaches 400, counter 116 resets to 0 and begins incrementing again. As counter 116 resets to 0, controller 102 outputs the low signal. The low signal is output by controller 102 until counter 116 reaches X again. The process continues, with counter 116 repeatedly counting between 0 and 400 and controller 102 repeatedly switching its output between high and low signals based on the value of X.

As described above, the value of X determines the duty cycle of the PWM signal output by each of the controllers 102 and 106, and each may have an independent value of X and corresponding duty cycle. For example, if X for controller 102 is 200, controller 102 outputs a low signal if the counter 116 is between 0 and 199, and outputs a high signal if the counter 116 is between 200 and 400. The low signal is output half of the time and the high signal is output half of the time, and therefore the duty cycle is 50%. To raise the duty cycle, the value of X is lowered. In another example, if the value of X is 100, controller 102 outputs a low signal if counter 116 is between 0 and 99. Controller 102 outputs a high signal if counter 116 is between 100 and 400. With X=100, the output from controller 102 is low 25% of the time and high 75% of the time, and the duty cycle is 75%. In another example, if the value of X is 300, controller 102 outputs a low signal if counter 116 is between 0 and 299. Controller 102 outputs a high signal if counter 116 is between 300 and 400. With X=300, the output from controller 102 is low 75% of the time and high 25% of the time, and the duty cycle is 25%. Therefore, adjusting the value of X changes the duty cycle of the PWM signal provided by controller 102.

Controller 106 operates similarly to controller 102. Oscillator 122 provides a clock for the components within controller 106. The actions of the components within controller 106 are synchronized using the clock provided by oscillator 122. Counter 124 is a counter that is useful for generating the PWM2 signal. Counter 124 is incremented by one at each clock cycle provided by the clock produced by oscillator 122. In one example, to generate the PWM2 signal, controller 106 outputs a low signal when counter 124 is between 0 and X−1, where X is a number between 0 and 400. When counter 124 reaches X, controller 106 outputs a high signal. Counter 124 operates similarly to counter 116 as described above, and controller 106 provides the PWM signal PWM2 to power stage 108.

The PWM signals PWM1 and PWM2 are provided using counters 116 and 124 as described above. The PWM signals PWM1 and PWM2 (and other PWM signals in systems with more than two power stages) may be synchronized so the power stages 104 and 108 (and any other power stages in the system) operate in synchronization with one another. In some examples, the PWM signals provided have a fixed phase shift from one another, such as 30° or 45°. The controllers that control the power stages 104 and 108, such as controllers 102 and 106, are independent. Therefore, at startup of power system 100, controllers 102 and 106 may begin operating at different times and may not be synchronized with one another. In addition, controllers 102 and 106 may drift apart over time, because oscillators 114 and 122 may vary slightly due to process variations or variations in operating conditions.

Because the clocks and the timing between controllers 102 and 106 in power system 100 may vary over time, a synchronization signal is useful to synchronize controllers 102 and 106. In this example, a synchronization signal is transmitted from controller 102 to controller 106 via link 126. The synchronization signal may be sent regularly at a certain interval, such as at a rising edge or a falling edge of the PWM signal PWM1 provided by controller 102. When the synchronization signal is received by controller 106, controller 106 resets its counter 124 to a predetermined count. Resetting counter 124 to the predetermined count synchronizes the PWM outputs (PWM1 and PWM2) provided by controllers 102 and 106.

The timing of the synchronization signal may cause a glitch in some alternative systems. In such systems, the secondary controller may reset its counter to the predetermined count as soon as the synchronization signal is received. If the rising edge of the PWM signal has already occurred because the counter in the secondary controller has reached X, the synchronization signal may be too late to adjust the counter for that cycle. In another scenario, if the counter is adjusted upward, the value X may be skipped and a PWM rising edge may be missed, causing a glitch in the PWM signal. These types of glitches are described with reference to FIG. 2A below.

In contrast, in examples herein, the secondary controller (like controller 106) receives the synchronization signal but does not immediately reset the counter (e.g., counter 124). Instead, controller 106 receives the synchronization signal and calculates the error between the time the synchronization signal is received and the time the synchronization signal was expected to have been received. Then, during subsequent cycles of the counter 124, the count is adjusted slowly by extending or reducing the period of the counter 124. The adjustment may be performed by a processor in controller 106, such as processor 118. The error may be measured in subsequent cycles as well, and the period adjusted accordingly. In this manner, the period is not changed suddenly, but the error is measured first and then the period is changed gradually, over more than one cycle if the adjustment is relatively large. By adjusting the period over more than one cycle if the adjustment is relatively large, transitions in the PWM pulses are not missed as they may be in alternative systems. This type of gradual adjustment is described with reference to FIGS. 2B and 3 below.

Figure 2A:
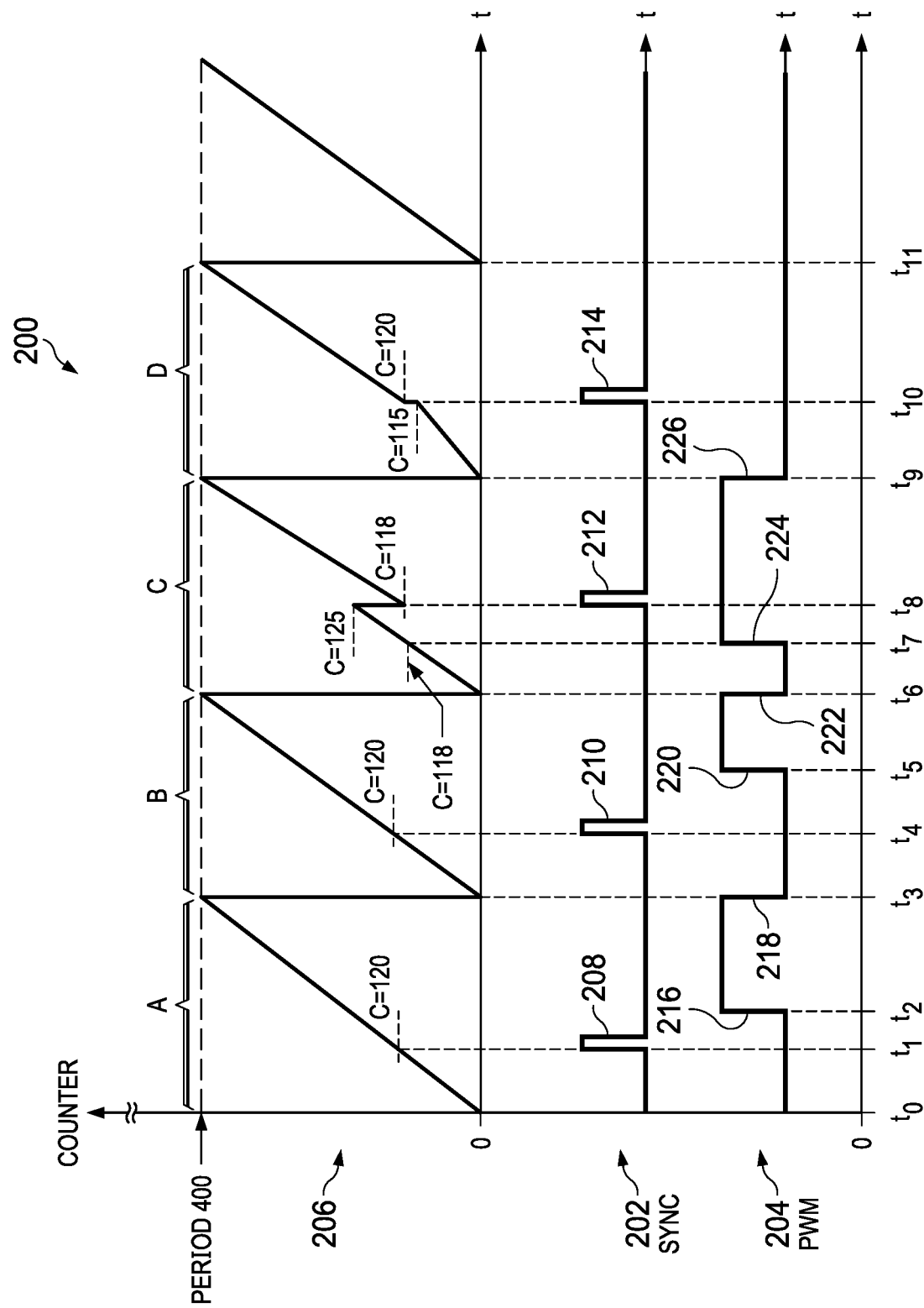
FIG. 2A shows example PWM and counter waveforms for controller synchronization in accordance with various examples.
Figure 2B:
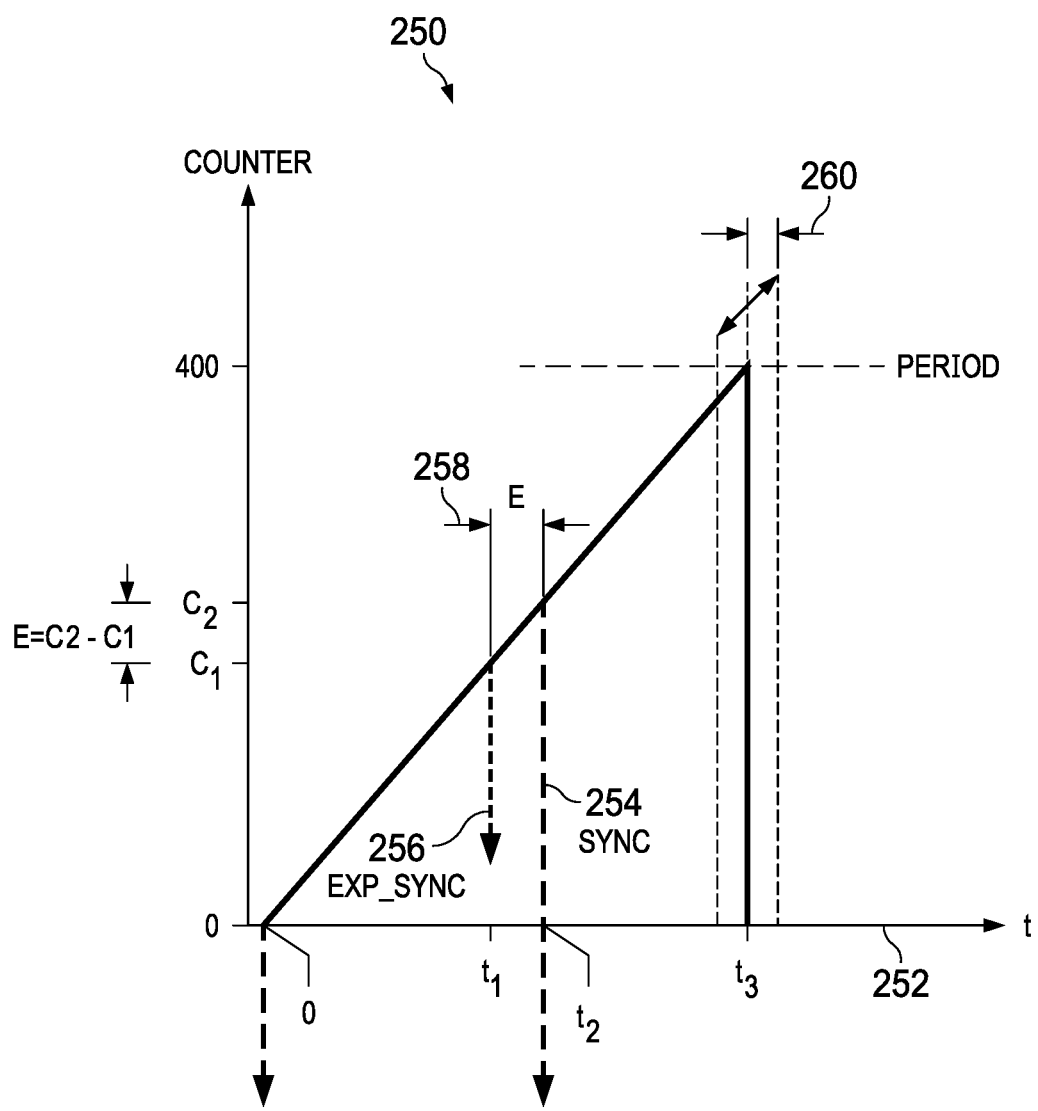
FIG. 2B shows an example PWM counter state for controller synchronization in accordance with various examples.

FIGS. 2A and 2B show example waveforms for controller synchronization in accordance with various examples herein. FIG. 2A shows example PWM and counter waveforms 200 for controller synchronization where the counter is immediately (or near immediately) reset after receipt of the synchronization signal. Waveform 202 is the synchronization signal (labeled SYNC), transmitted from controller 102 to controller 106. Waveform 204 is the PWM signal provided by controller 106. Waveform 206 is the sawtooth waveform that represents the count from counter 124. In this example, the count begins at 0 and continues to 400, but other counts may be used in other examples. Four periods or cycles of the counter are shown, labeled A, B, C, and D in FIG. 2A.

Waveform 202 shows four synchronization signals 208, 210, 212, and 214. The synchronization signals (208, 210, 212, and 214) are transmitted from a primary controller (like controller 102) to a secondary controller (like controller 106) in one example. The synchronization signals (208, 210, 212, and 214) may arrive at controller 106 at any time. In this example, one synchronization signal (208, 210, 212, and 214) arrives at controller 106 during each period A, B, C, and D. In an alternative system, a secondary controller receives the synchronization signals (such as synchronization signals 208, 210, 212, and 214) and then resets its counter to a predetermined value. The predetermined value may be stored in a memory.

Waveform 204 is the PWM signal provided by controller 106 to power stage 108. The duty cycle of the PWM cycle is determined by counter 124. The value of counter 124 sets the rising edges and the falling edges of waveform 204. Rising and falling edges are labeled 216, 218, 220, 222, 224, and 226. Edges 216, 220, and 224 are rising edges, while edges 218, 222, and 226 are falling edges.

In operation, at time $t_0$, counter 124 begins a count from 0. Counter 124 increments at each clock signal from a clock source, such as oscillator 122. In this example, counter 124 will increment from 0 to 400, and then drop back to 0 and begin incrementing again for the next period. When counter 124 reaches a certain count, waveform 204 transitions from low to high, initiating a rising edge in the PWM signal. The value of counter 124 at the time this occurs determines the duty cycle of the PWM signal.

At time $t_1$, synchronization signal 208 is received by controller 106. Controller 106 resets counter 124 to a predetermined value after receipt of synchronization signal 208. In this example, counter 124 is at a count of C=120 when synchronization signal 208 is received. For period A, the predetermined value for counter 124 to reset to after receipt of synchronization signal 208 is C=120. Therefore, counter 124 is synchronized with a counter (such as counter 116) in a primary controller (such as controller 102), and counter 124 can continue without resetting the count for this period. The sawtooth waveform 206 is depicted as a straight line for period A, with no reset of the count performed in this example. As described above, in this system the synchronization signal 208 may be received by controller 106 at any time during the period.

At time $t_2$, waveform 204 transitions from low to high. Rising edge 216 indicates this transition. Rising edge 216 occurs at a predetermined value of counter 124. In this period, the rising edge 216 occurs after synchronization signal 208 was received by controller 106. For example, rising edge 216 may have been programmed to occur when the count C=140.

At time $t_3$, counter 124 reaches 400 and resets to 0. When counter 124 resets to 0, waveform 204 transitions from a high value to a low value. This transition is indicated by falling edge 218. After time $t_3$, counter 124 begins incrementing again from 0 and period B begins. Waveform 204 will remain low until the next predetermined value of counter 124 is reached to indicate the next rising edge. The predetermined value for period B may be the same as the predetermined value in period A (where C=140 initiated the rising edge) or it may be a different value for period B. A different predetermined value that initiates the rising edge is shown for period B in this example.

At time $t_4$, synchronization signal 210 is received by controller 106. Controller 106 resets counter 124 to a predetermined value after receipt of synchronization signal 210. In this example, counter 124 is at a count of C=120 when synchronization signal 210 is received. For period B, the predetermined value that counter 124 is reset to after receipt of synchronization signal 210 is C=120. Therefore, counter 124 is synchronized with a counter (such as counter 116) in a primary controller (such as controller 102), and counter 124 can continue without resetting the count for period B. The sawtooth waveform 206 is depicted as a straight line for period B, with no reset of the count performed in this example.

At time $t_5$, waveform 204 transitions from low to high. Rising edge 220 indicates this transition. Rising edge 220 occurs at a predetermined value of counter 124. In this period, the rising edge 220 occurs after synchronization signal 210 was received by controller 106. For example, rising edge 220 may have been programmed to occur when the count C=250. Rising edge 220 occurs later in the count from counter 124 than rising edge 216, which means that the duty cycle for period B is smaller than the duty cycle for period A. The duty cycles may be observed visually in waveform 204, where the length of time that waveform 204 is high is longer during period A than during period B.

At time $t_6$, counter 124 reaches 400 and resets to 0. When counter 124 resets to 0, waveform 204 transitions from a high value to a low value. This transition is indicated by falling edge 222. After time $t_6$, counter 124 begins incrementing again from 0 and period C begins. Waveform 204 will remain low until the next predetermined value of counter 124 is reached to indicate the next rising edge.

At time $t_7$, waveform 204 transitions from low to high. Rising edge 224 indicates this transition. In period C, the rising edge 224 is initiated when the count C=118.

At time $t_8$, synchronization signal 212 is received by controller 106. Controller 106 resets counter 124 to a predetermined value after receipt of synchronization signal 212. In this example, counter 124 is at a count of C=125 when synchronization signal 212 is received. For period C, the predetermined value that counter 124 is reset to after receipt of synchronization signal 212 is C=118. Therefore, counter 124 is not synchronized with the primary controller 102. Counter 124 is reset to the predetermined value (C=118) to become synchronized with the primary controller 102. In this example, the reset of counter 124 occurs immediately or near immediately after receipt of synchronization signal 212. Therefore, counter 124 drops from 125 to 118, and this drop is shown in period C of sawtooth waveform 206. The drop in counter 124 during period C shows one example of a problem with alternative systems. The rising edge for period C is initiated at a count of C=118, which occurred at time $t_7$. When counter 124 dropped to C=118 after receipt of synchronization signal 212, the count C=118 occurred for a second time in period C. This second occurrence of count C=118 in period C may cause a glitch in waveform 204, because waveform 204 has already transitioned from low to high in period C and may attempt to transition a second time. Therefore, a sudden change in the count of counter 124 responsive to a synchronization signal could cause a glitch in the PWM signal provided by controller 106. Because the synchronization signals could be received by controller 106 at any time, controller 106 cannot prevent a change in counter 124 near the time that a transition in waveform 204 occurs, which can cause glitches in the alternative systems. Examples described below can prevent these types of glitches caused by the timing of the synchronization signals.

At time $t_9$, counter 124 reaches 400 and resets to 0. When counter 124 resets to 0, waveform 204 transitions from a high value to a low value. This transition is indicated by falling edge 226. After time $t_9$, counter 124 begins incrementing again from 0 and period D begins. Waveform 204 will remain low until the next predetermined value of counter 124 is reached to indicate the next rising edge.

At time to, synchronization signal 214 is received by controller 106. Controller 106 resets counter 124 to a predetermined value after receipt of synchronization signal 214. In this example, counter 124 is at a count of C=115 when synchronization signal 214 is received. For period D, the predetermined value that counter 124 is reset to after receipt of synchronization signal 214 is C=120. Therefore, counter 124 is not synchronized with the primary controller 102. Counter 124 is reset to the predetermined value (C=120) to become synchronized with the primary controller 102. In this example, the reset of counter 124 occurs immediately or near immediately after receipt of synchronization signal 214. Therefore, counter 124 jumps from 115 to 120, and this jump is shown in period D of sawtooth waveform 206. The jump in counter 124 during period D shows another example of a problem with alternative systems. In this period, the rising edge for waveform 204 is initiated at the count C=118 of counter 124. However, counter 124 jumped from 115 to 120 after receipt of synchronization signal 214. Therefore, the count of C=118 never occurred, and waveform 204 does not transition from low to high during period D. The pulse for the waveform 204 is missed during period D due to the increase of the count of counter 124 from 115 to 120.

At time $t_{11}$, counter 124 reaches 400 and resets to 0. When counter 124 resets to 0, waveform 204 transitions from a high value to a low value. In this example, waveform 204 is already low due to the missed transition during period D. After time $t_{11}$, counter 124 begins incrementing again from 0 and the next period begins. Waveform 204 will remain low until the next predetermined value of counter 124 is reached to indicate the next rising edge during the next period.

FIG. 2A shows an example of the glitches that may be present in a PWM waveform such as waveform 204 when a counter is reset after receipt of a synchronization signal. In examples herein, these types of glitches may be prevented by measuring an error when the synchronization signal is received. Then, the period of the counter 124 is adjusted over the next one or more periods until counter 124 is synchronized with the primary controller 102. This example is described with respect to FIG. 2B.

FIG. 2B is a waveform 250 of a PWM counter state for controller synchronization in accordance with various examples herein. A timeline 252 is shown along the x-axis, while the y-axis indicates the count of a counter, such as counter 124. Waveform 250 is a portion of a sawtooth waveform that represents the count from counter 124. FIG. 2B shows a time of a synchronization signal SYNC 254, a time of an expected synchronization signal EXP_SYNC 256, an error (E) 258, and a period adjustment 260. In the example shown in FIG. 2B, counter 124 has a period of 0 to 400. After counter 124 reaches 400, counter 124 resets to 0. Only one period of counter 124 is shown in FIG. 2B.

In operation, controller 106 tracks the timing of SYNC 254 and EXP_SYNC 256. SYNC 254 is the synchronization signal from a primary controller, such as controller 102. SYNC 254 is received at controller 106 at a time $t_2$. EXP_SYNC 256 is the predetermined time at which controller 106 expects to receive SYNC 254, if controller 102 is synchronized with controller 106. In one example, the primary controller, such as controller 102, provides the secondary controllers, such as controller 106, with the expected time that the secondary controllers should receive the SYNC signal. The expected time is based on the time that primary controller 102 is programmed to send the SYNC signal to the secondary controllers. At the secondary controllers, the expected time is denoted as EXP_SYNC 256. In FIG. 2B, controller 106 expects to receive the synchronization signal from controller 102 at time $t_1$. At time $t_1$, counter 124 is at count C1. If controller 102 and controller 106 are synchronized, controller 106 will receive SYNC 254 at time $t_1$, when counter 124 is at count C1. If controller 102 and controller 106 are synchronized, no adjustment to counter 124 is performed.

In this example, controller 102 and controller 106 are not synchronized. Therefore, SYNC 254 arrives at controller 106 later than expected, at time $t_2$. At time $t_2$, counter 124 is at count C2. If controller 102 and controller 106 are not synchronized, processor 118 in controller 106 calculates the difference between C1 and C2. This difference is a measure of the amount of error between the controllers 102 and 106. The error in this example is E=C2−C1. Processor 118 calculates this error (E 258) and stores the value of the error in memory 120. The magnitude of E 258 indicates how far out of synchronization controller 106 is from controller 102.

After calculating E 258, processor 118 will adjust the length of the period of counter 124 during subsequent periods until controller 106 is synchronized with controller 102. The period may be adjusted by increasing or decreasing the value at which the counter 124 is reset, by increasing or decreasing the value to which the counter 124 is reset, by increasing or decreasing the increment amount of the counter, or other suitable technique. In the current period, the period ends at time $t_3$. Adjusting the length of the period of counter 124 may prevent the glitches in the PWM waveforms that occur in alternative systems. A period adjustment 260 is shown in FIG. 2B. The period of counter 124 may be increased or decreased depending on the direction and magnitude of E 258.

In one example, the period of counter 124 is 400, C2 is 200, and C1 is 195. E 258 is therefore 200−195, or 5. That is, counter 124 is off by 5 counts, based on the receipt of SYNC 254. The synchronization signal was expected at count 195, but did not arrive until count 200. Counter 124 is therefore 5 counts ahead of counter 116 in controller 102. In this example, processor 118 calculates the error of 5 and stores that error in memory 120. Then, in subsequent cycles, processor 118 will adjust the period of counter 124 to attempt to synchronize counter 124 with counter 116. In one example, processor 118 can extend the period of counter 124 from 400 counts to 401 counts for this period. Then, in the next period, assuming that counter 124 is still not synchronized with counter 116, processor 118 again extends the period of counter 124 from 400 counts to 401. Processor 118 can measure E 258 during each period and continually adjust the period of counter 124 until E 258 reaches 0. During each subsequent period, processor 118 continues to monitor the timing of SYNC 254 and continues to adjust the period of counter 124 to synchronize counter 124 to counter 116. Therefore, processor 118 provides continuous error correction according to examples herein.

Processor 118 may adjust the period of counter 124 in either direction. Processor 118 may increase the period of counter 124 if counter 124 is ahead of counter 116. Processor 118 may decrease the period of counter 124 if counter 124 is behind counter 116. In some examples, processor 118 may increase or decrease the period by a count of 1 each time processor 118 makes an adjustment. In other examples, processor 118 may increase or decrease the period by a count greater than 1. For example, if counter 124 is off by a large number, such as 20, processor 118 may adjust the period of counter 124 by 2, 3, 4, or even more during each period so that counter 124 synchronizes with counter 116 more quickly.

In some examples, processor 118 may adjust the period of counter 124 during the same period that E 258 is calculated. In other examples, processor 118 may wait until the current period finishes, and then adjust the period of counter 124 during the next period. Depending on when SYNC 254 is received, and how quickly processor 118 can calculate E 258, processor 118 may not be able to adjust the current period before the period ends and the next period begins. Therefore, processor 118 may calculate E 258 and then wait until the next period begins before adjusting the period of counter 124.

Adjusting the length of the period of counter 124 as described above may prevent the glitches found in alternative systems that attempt to synchronize power controllers. In such alternative systems, a counter may undergo a sharp increase or decrease in its count when the synchronization signal is received. This sharp increase or decrease may cause PWM transitions to be missed, or may cause PWM transitions to be triggered multiple times. In the examples described herein, the count of counter 124 does not undergo an increase or decrease while in operation, but instead the period for the counter is shortened or lengthened. Therefore, no PWM transitions are missed or triggered multiple times based on a change or adjustment in the count of counter 124.

Figure 3:
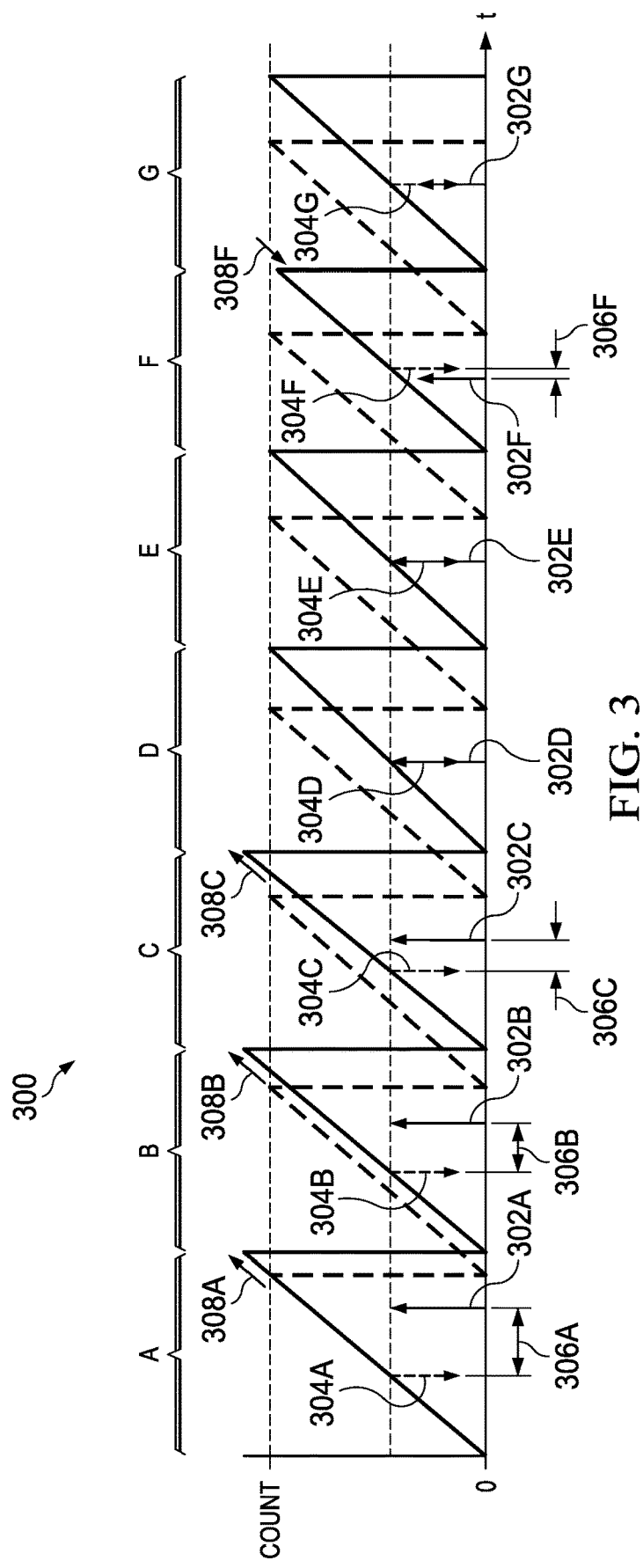
FIG. 3 is a waveform for controller synchronization in accordance with various examples.

FIG. 3 is a waveform 300 for controller synchronization in accordance with various examples herein. Waveform 300 shows error correction applied over multiple periods, as described above. Seven periods are shown in waveform 300, labeled A through G. Synchronization (SYNC) signals 302A to 302G are shown (collectively, SYNC signals 302), with one SYNC signal 302 arriving during each of the seven periods A to G. SYNC signals 302 are represented by upward point arrows. Expected SYNC signals 304A to 304G are also shown (collectively, expected SYNC signals 304), with one expected SYNC signal 304 shown for each of the seven periods A to G. Errors 306A, 306B, 306C, and 306F are shown for some of the periods (collectively, errors 306).

The errors 306 indicate the difference between the arrival time of the SYNC signal 302 and the expected SYNC signal 304. Waveform 300 also shows several adjustments 308A, 308B, 308C, and 308F (collectively, adjustments 308). These adjustments 308 indicate the change in the length of the period for the counter when an error 306 is present in the counter.

In period A, the expected SYNC signal 304A occurs before the SYNC signal 302A. The time difference between these two signals is shown as error 306A. Because the SYNC signal 302A arrived after its expected time, the counter for this waveform 300 (such as counter 124) is ahead of the reference counter (such as counter 116) during period A. Therefore, period A should be extended until counter 124 is synchronized with counter 116. Adjustment 308A shows that period A has been extended slightly to begin the process of error correction.

In period B, the expected SYNC signal 304B occurs before the SYNC signal 302B. The time difference between these two signals is shown as error 306B. Error 306B is smaller than error 306A, so the adjustment in the previous period A (adjustment 308A) has reduced the error but not yet eliminated it. Therefore, period B should be extended again because counter 124 is not yet synchronized with counter 116. Adjustment 308B shows that period B has been extended slightly to continue the process of error correction.

In period C, the expected SYNC signal 304C occurs before the SYNC signal 302C. The time difference between these two signals is shown as error 306C. Error 306C is smaller than error 306B, so the adjustment in the previous period B (adjustment 308B) has reduced the error but not yet eliminated it. Therefore, period C should be extended again because counter 124 is not yet synchronized with counter 116. Adjustment 308C shows that period C has been extended slightly to continue the process of error correction.

In period D, the expected SYNC signal 304D occurs at the same time as SYNC signal 302D. Therefore, the error is zero, and no adjustment is implemented for period D. The controller 106 maintains the current period of the counter 124 if the error is zero.

In period E, the expected SYNC signal 304E occurs at the same time as SYNC signal 302E. Therefore, the error is still zero, and no adjustment is implemented for period E. The controller 106 maintains the current period of the counter 124 if the error is zero.

In period F, the expected SYNC signal 304F occurs after the SYNC signal 302F. The time difference between these two signals is shown as error 306F. Because the SYNC signal 302F arrived before its expected time, the counter for period F (such as counter 124) is behind the reference counter (such as counter 116). Therefore, period F should be shortened until counter 124 is synchronized with counter 116. Adjustment 308F shows that period F has been shortened slightly to adjust for the error.

In period G, the expected SYNC signal 304G occurs at the same time as SYNC signal 302G. Therefore, the error is zero, and no adjustment is implemented for period G. The examples in FIG. 3 show how a processor or controller can continually measure an error and adjust a period of a counter to synchronize a secondary controller with a primary controller.

Figure 4:
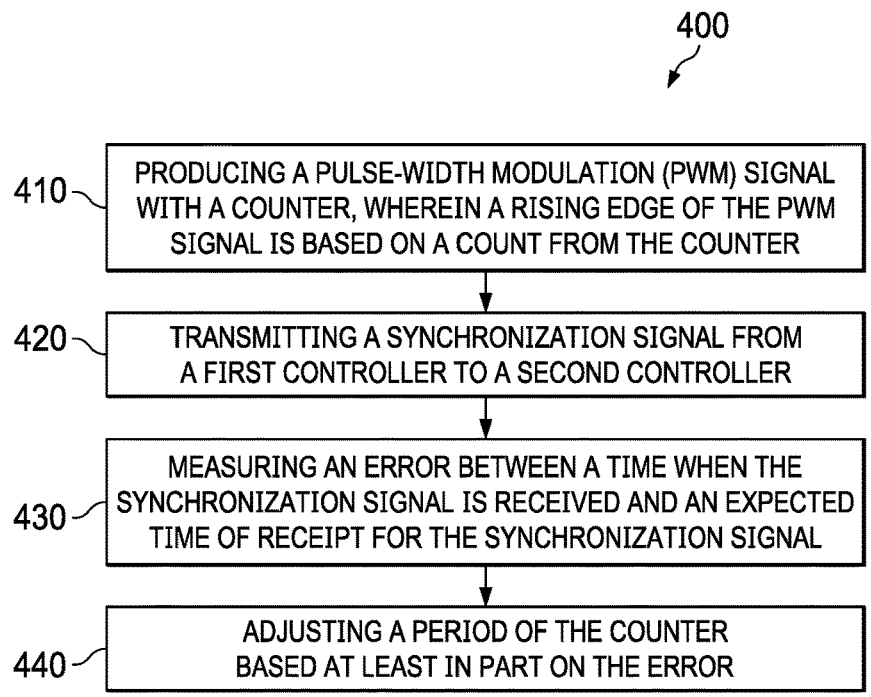
FIG. 4 is a flow diagram of a method for controller synchronization in accordance with various examples.

FIG. 4 is a flow diagram of a method 400 for controller synchronization in accordance with various examples herein. The steps of method 400 may be performed in any suitable order. The hardware components described above with respect to FIG. 1 may perform method 400 in one example, such as controller 106 or processor 118.

Method 400 begins at 410, where a controller produces a PWM signal with a counter, where a rising edge of the PWM signal is based on a count from the counter. In this step, the controller that produces the PWM signal is a secondary controller, such as controller 106. A falling edge may be used instead of a rising edge in other examples. As described above, counter 124 in controller 106 produces a count, and that count is used by controller 106 to provide a PWM signal, such as PWM2, to a power stage 108. The rising and falling edges of the PWM2 signal are determined by the count from the counter 124. The frequency of the PWM2 signal may be adjusted by changing the period of the count from counter 124. The duty cycle of the PWM2 signal may be adjusted by initiating the rising or the falling edges of the PWM2 signal on different counts from counter 124.

Method 400 proceeds at 420, where a synchronization signal is transmitted from a first controller to a second controller. As described above, a primary controller such as controller 102 (e.g., the first controller) may transmit synchronization signals to one or more secondary controllers, such as controller 106 (e.g., the second controller). The synchronization signals are used by each of the secondary controllers to synchronize the PWM outputs with the primary controller. The PWM outputs from the secondary controllers may be in phase with the PWM output from the primary controller, or the PWM outputs from the secondary controllers may be out of phase with the PWM output from the primary controller.

Method 400 continues at 430, where the second controller, such as controller 106, measures an error between a time when the synchronization signal is received at the second controller and an expected time of receipt for the synchronization signal. The error measurement may be performed by any suitable hardware or software in controller 106. For example, processor 118 in controller 106 may measure the error and store the error in memory 120.

Method 400 continues at 440, where the second controller, such as controller 106, adjusts a period of the counter based at least in part on the error. As described above, the period of the counter may be shortened or lengthened depending on whether the synchronization signal arrives at controller 106 before or after it is expected to arrive at controller 106. The period of the counter may be adjusted one or more periods after the error is measured. The period of the counter may be adjusted by a count of one, or by a fixed amount greater than one. The fixed amount of the adjustment may be based on the size of the error in one example. A larger error may be accompanied by a larger fixed amount of adjustment of the period, so the controller reaches synchronization over a smaller number of periods. The method may then return to block 410, where the PWM signal is produced at the second controller using the counter with the adjusted period.

In examples herein, updating the period of the counter in the secondary controller in the manner described above prevents fast and large changes in the count of the counter that may cause PWM glitches. By adjusting the period of the counter using the techniques described herein, PWM pulses are not missed due to abrupt changes in the counter. In addition, triggering multiple rising or falling edges of the PWM signal in a single period is eliminated by using the examples described herein. Secondary controllers may be continually updated using the examples described herein to remain in proper synchronization with a primary controller.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Unless otherwise stated, "about," "approximately," or "substantially" preceding a value means+/−10 percent of the stated value. Modifications are possible in the described examples, and other examples are possible within the scope of the claims.

What is claimed is:

1. A method, comprising:
    producing a pulse-width modulation (PWM) signal with a counter, wherein a rising or falling edge of the PWM signal is based on a count from the counter;
    transmitting a synchronization signal from a first controller to a second controller;
    measuring an error between a time when the synchronization signal is received at the second controller and an expected time of receipt for the synchronization signal; and
    adjusting a period of the counter based at least in part on the error.

2. The method of claim 1, wherein the synchronization signal is a first synchronization signal, the error is a first error, and the method further comprises:
    receiving a second synchronization signal at the second controller, wherein the second synchronization signal is transmitted by the first controller;
    measuring a second error between a time when the second synchronization signal is received at the second controller and an expected time of receipt for the second synchronization signal; and
    adjusting the period of the counter based at least in part on the second error.

3. The method of claim 1, wherein the counter is a first counter, and wherein the synchronization signal indicates a count from a second counter in the first controller.

4. The method of claim 1, wherein adjusting the period of the counter includes:
    increasing the period if the synchronization signal is received after the expected time of receipt; and
    decreasing the period if the synchronization signal is received before the expected time of receipt.

5. The method of claim 1, wherein adjusting the period of the counter includes:
    adjusting the period after the counter has reset.

6. The method of claim 1, wherein adjusting the period of the counter includes:
    increasing or decreasing the period by a count of one.

7. The method of claim 1, wherein adjusting the period of the counter includes:

adjusting the period of the counter by a fixed amount, wherein the fixed amount is based at least in part on a size of the error.

8. The method of claim 1, further comprising:
maintaining the period of the counter responsive to the error being zero.

9. The method of claim 1, wherein the first controller is configured to transmit the expected time of receipt for the synchronization signal to the second controller.

10. A system, comprising:
a first controller configured to transmit a synchronization signal to a second controller;
the second controller configured to produce a pulse-width modulation (PWM) signal; and
a counter configured to provide a count for the second controller, wherein the second controller is configured to initiate rising edges and falling edges of the PWM signal based on the count from the counter, and wherein the second controller is also configured to:
measure an error between a time when the synchronization signal is received at the second controller and an expected time of receipt for the synchronization signal; and
adjust a period of the counter based at least in part on the error.

11. The system of claim 10, wherein, to adjust the period of the counter, the second controller is configured to:
increase the period responsive to the synchronization signal being received after the expected time of receipt; and
decrease the period responsive to the synchronization signal being received before the expected time of receipt.

12. The system of claim 10, wherein the second controller is configured to:
adjust the period of the counter by adjusting the period after the counter has reset.

13. The system of claim 10, wherein the second controller is configured to:
adjust the period of the counter by increasing or decreasing the period by a count of one.

14. The system of claim 10, wherein the second controller is configured to:
adjust the period of the counter by a fixed amount, wherein the fixed amount is based at least in part on a size of the error.

15. The system of claim 10, wherein the second controller is configured to:
initiate a falling edge of the PWM signal when the period of the counter is reset.

16. The system of claim 10, wherein the second controller is configured to:
maintain the period of the counter responsive to the error being zero.

17. A system, comprising:
a first controller configured to:
produce a pulse-width modulation (PWM) signal with a counter, wherein a rising edge of the PWM signal is based on a count from the counter;
receive a synchronization signal from a second controller;
measure an error between a time when the synchronization signal is received and an expected time of receipt for the synchronization signal; and
adjust a period of the counter based at least in part on the error.

18. The system of claim 17, wherein the first controller is configured to:
increase the period of the counter responsive to the synchronization signal being received after the expected time of receipt; and
decrease the period of the counter responsive to the synchronization signal being received before the expected time of receipt.

19. The system of claim 17, wherein the first controller is configured to:
adjust the period of the counter by a fixed amount, wherein the fixed amount is based at least in part on a size of the error.

20. The system of claim 17, wherein the first controller is configured to:
adjust the period after the counter has reset.

* * * * *